United States Patent
Chidambarrao et al.

(10) Patent No.: US 7,144,767 B2
(45) Date of Patent: Dec. 5, 2006

(54) NFETS USING GATE INDUCED STRESS MODULATION

(75) Inventors: Dureseti Chidambarrao, Weston, CT (US); Omer H. Dokumaci, Wappingers Falls, NY (US); Oleg G. Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 10/667,601

(22) Filed: Sep. 23, 2003

(65) Prior Publication Data
US 2005/0064646 A1   Mar. 24, 2005

(51) Int. Cl.
*H01L 21/8249* (2006.01)
(52) U.S. Cl. .............. 438/236; 438/199; 438/216; 438/229; 438/230; 438/231; 438/232; 438/233; 438/279
(58) Field of Classification Search ........... 438/199, 438/216, 218, 229–233, 279
See application file for complete search history.

(56) References Cited

U.S. PATENT DOCUMENTS

| | | | |
|---|---|---|---|
| 3,602,841 A | 8/1971 | McGroddy | |
| 4,465,705 A * | 8/1984 | Ishihara et al. | 438/423 |
| 4,517,731 A * | 5/1985 | Khan et al. | 438/210 |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |

(Continued)

FOREIGN PATENT DOCUMENTS

JP   64-76755   3/1989

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Ha Nguyen
*Assistant Examiner*—Kyoung Lee
(74) *Attorney, Agent, or Firm*—Joseph P. Abate, Esq.; Greenblum & Bernstein, P.L.C.

(57) ABSTRACT

A method for manufacturing an integrated circuit comprising a plurality of semiconductor devices including an n-type field effect transistor and a p-type field effect transistor by covering the p-type field effect transistor with a mask, and oxidizing a portion of a gate polysilicon of the n-type field effect transistor, such that tensile mechanical stresses are formed within a channel of the n-type field effect transistor.

35 Claims, 10 Drawing Sheets

U.S. PATENT DOCUMENTS

| | | | |
|---|---|---|---|
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,828,131 A * | 10/1998 | Cabral et al. | 257/757 |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,981,356 A | 11/1999 | Hsueh et al. | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,080,637 A | 6/2000 | Huang et al. | |
| 6,090,684 A | 7/2000 | Ishitsuka et al. | |
| 6,093,621 A | 7/2000 | Tseng | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,204,103 B1 * | 3/2001 | Bai et al. | 438/224 |
| 6,221,735 B1 | 4/2001 | Manley et al. | |
| 6,228,694 B1 * | 5/2001 | Doyle et al. | 438/199 |
| 6,246,095 B1 | 6/2001 | Brady et al. | |
| 6,255,169 B1 | 7/2001 | Li et al. | |
| 6,261,964 B1 | 7/2001 | Wu et al. | |
| 6,274,444 B1 | 8/2001 | Wang | |
| 6,281,532 B1 | 8/2001 | Doyle et al. | |
| 6,284,626 B1 | 9/2001 | Kim | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,975 B1 | 6/2002 | Brunner et al. | |
| 6,406,973 B1 | 6/2002 | Lee | |
| 6,461,981 B1 * | 10/2002 | Chang | 438/769 |
| 6,476,462 B1 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B1 | 1/2003 | Jan et al. | |
| 6,509,618 B1 | 1/2003 | Jan et al. | |
| 6,521,964 B1 | 2/2003 | Jan et al. | |
| 6,531,369 B1 | 3/2003 | Ozkan et al. | |
| 6,531,740 B1 | 3/2003 | Bosco et al. | |
| 6,573,172 B1 * | 6/2003 | En et al. | 438/626 |
| 6,583,060 B1 | 6/2003 | Trivedi | |
| 6,717,216 B1 | 4/2004 | Doris et al. | |
| 6,825,529 B1 | 11/2004 | Chidambarrao et al. | |
| 6,831,292 B1 | 12/2004 | Currie et al. | |
| 6,974,981 B1 | 12/2005 | Chidambarrao et al. | |
| 6,977,194 B1 | 12/2005 | Belyansky et al. | |
| 7,015,082 B1 | 3/2006 | Doris et al. | |
| 2002/0031909 A1 * | 3/2002 | Cabral et al. | 438/655 |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2004/0046219 A1 * | 3/2004 | Ueno et al. | 257/412 |
| 2004/0097030 A1 * | 5/2004 | Sayama et al. | 438/232 |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode'Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper.6.2. pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Trasistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx S1 1-x/Si Strained-Layer Superlattice Grown by Molecular Beam Epitaxy". J. Vac. Sci. Technol. A 2(2), Apr. -Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlatties". J. Appl. Phys. 64 (6), Sep. 15, 1988, pp. 3043-3050.

D.C. Houghton, et al., "Equilibrium Critical Thickness for SI I-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

NFETS USING GATE INDUCED STRESS MODULATION

BACKGROUND OF THE INVENTION

1. Field of Invention

The invention generally relates to methods for manufacturing a semiconductor device with improved device performance, and more particularly to methods for manufacturing semiconductor devices which impose tensile and compressive stresses in the substrate of the device during device fabrication.

2. Background Description

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices, e.g., NFETs and/or p-type devices, e.g., PFETs. However, the same stress component, either tensile stress or compressive stress, discriminatively affects the characteristics of an n-type device and a p-type device.

In order to maximize the performance of both NFETs and PFETs within integrated circuit (IC) chips, the stress components should be engineered and applied differently for NFETs and PFETs. That is, because the type of stress which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contain a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal direction.

Alternatively, liners on gate sidewalls, have been proposed to selectively induce the appropriate strain in the channels of the FET devices (see Ootsuka et al., IEDM 2000, p. 575, for example). By providing liners, the appropriate stress is applied closer to the device than the stress applied as a result of the trench isolation fill technique.

While these methods do provide structures that have tensile stresses being applied to the NFET device and compressive stresses being applied along the longitudinal direction of the PFET device, they may require additional materials and/or more complex processing, and thus, resulting in higher cost. In addition, in the methods described above, for example, the stresses in the channel are relatively moderate (i.e., for example, about 200 to about 300 MPa), which provide approximately a 10% benefit in device performance. Thus, it is desired to provide more cost-effective and simplified methods for creating stronger tensile and compressive stresses in the channels NFETs and PFETs, respectively. It is further desired to create larger tensile stresses in the channels of the NFETs than the tensile stresses created as a result of the known processes described above.

SUMMARY OF THE INVENTION

In a first aspect, this invention provides a method for manufacturing an integrated circuit comprising a plurality of semiconductor devices including an n-type field effect transistor and a p-type field effect transistor by covering the p-type field effect transistor with a mask. A portion of a gate polysilicon of the n-type field effect transistor is oxidized such that tensile mechanical stresses are formed within a channel of the n-type field effect transistor.

In a second aspect, this invention separately provides a method for manufacturing an integrated circuit comprising a plurality of semiconductor devices including an n-type field effect transistor and a p-type field effect transistor on a semiconductor wafer by oxidizing a portion of a gate polysilicon of the n-type field effect transistor, such that tensile mechanical stresses are formed within a channel of the n-type field effect transistor, without creating additional tensile stresses in a channel of the p-type field effect transistor.

In a third aspect, this invention separately provides an integrated circuit, including: a p-type transistor having a polysilicon layer and an n-type transistor having a polysilicon layer, wherein, after oxidation of the polysilicon layer of the n-type transistor, the polysilicon layer of the n-type transistor has an oxide edge with the shape of a vertical bird's beak.

DETAILED DESCRIPTION OF AN EMBODIMENT OF THE INVENTION

The invention provides a method for fabricating devices with improved performance characteristics. In this invention, oxidation of the gate polysilicon is used to control the stresses in complimentary metal oxide semiconductor (CMOS) NFET devices such that their performances are enhanced without degrading the performance of the PFET devices.

In one aspect of the invention, polysilicon of an NFET gate is oxidized while the polysilicon of a PFET gate is masked to prevent the polysilicon of the PFET from being oxidized. By preventing the oxidation of the polysilicon of the PFET, degradation of hole mobility is prevented. In this aspect, the oxidation of NFET gates creates tensile stresses in the channels of the NFETs without creating tensile stresses in the channel of the PFETs. By oxidizing the gate polysilicon of the NFETs large stresses of about 500 MPa to about 1000 MPa, for example, are formed in a channel of the NFET. In one implementation the stresses are about 700

MPa. By providing tensile stresses to the channel of the NFET without providing tensile stresses in the channel of PFET, the charge mobility and drive current along the channels of the NFET devices are enhanced without diminishing the charge mobility and drive current along the channels of the PFET devices.

By implementing the stresses using a polysilicon over-etch, this invention provides the implementation of stresses which are self-aligned to the gate, whereas in the isolation induced stress structures, the stresses are not self aligned to the gate. This invention also provides stress levels in the silicon under the gate which are much larger than the isolation-based or liner-based approaches.

Also, when gates that are confined by oxide fill are used, the expansion of the oxide in the gate stack is relatively confined. Further, when a confined gate is subjected to oxidation, the gate channel is put under tension. The gate is put under tension because oxide deposited thereon expands outwardly at the top. This results in compression in the top part of the isolation. At the same time, by inducing bending stresses at the bottom part of the isolation, next to the polysilicon under tension, the channel receives large tensile stresses. These stress levels are on the order of about 500 to about 1000 MPa and these tensile stresses are beneficial to the NFET drive currents. In this invention, the PFETs are masked during oxidation of the NFETs so that the creation of tensile stresses from this oxidation step in the PFETs is substantially and/or completely prevented in order to not diminish the performance of the PFET. Thus, the invention provides for tensile stresses along the channel of the NFETs without providing tensile stresses along the channels of the PFETs to improve the performance of the NFET devices without diminishing the performance of the PFET devices.

Figure 1:
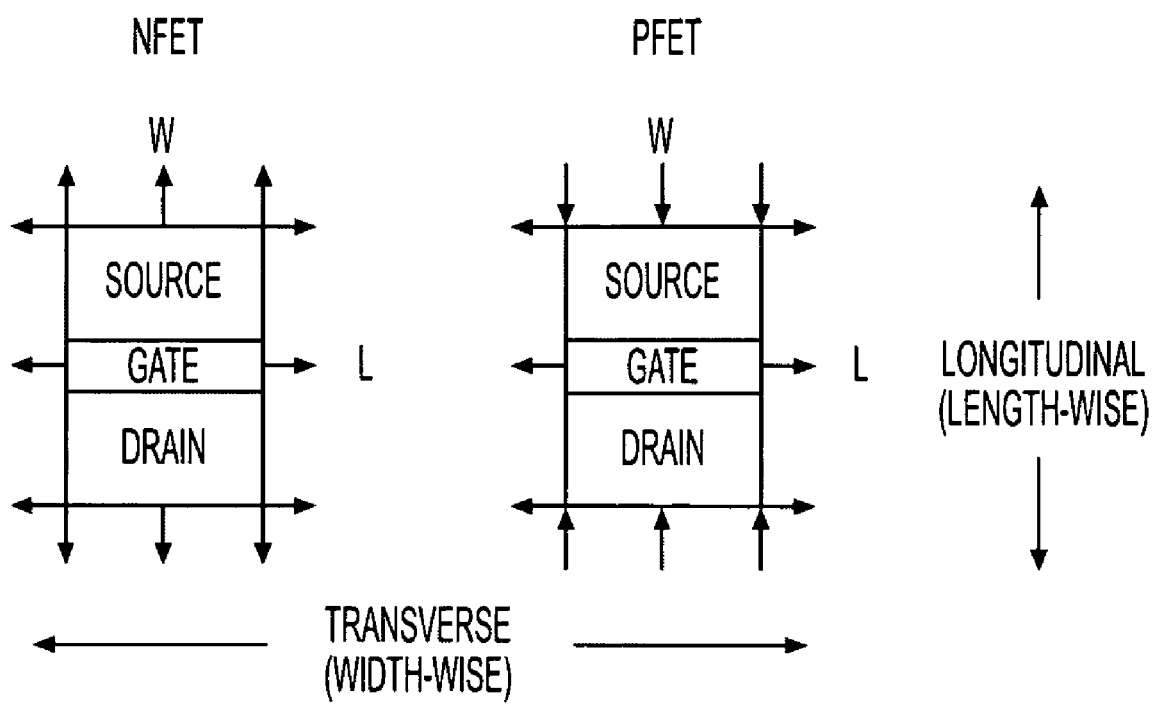
FIG. 1 depicts desired stress states for PFETs and NFETs.

FIG. 1 illustrates desired stress states for improving the performance of PFETs and NFETs (see Wang et al, IEEE Trans. Electron Dev., v.50, p. 529, 2003). In FIG. 1, an NFET and a PFET are shown to have a source region, a gate region and a drain region. The NFET and PFET are shown to have arrows extending outward from the active area to illustrate tensile stresses. The arrows extending inward toward the PFET device are illustrative of compressive forces. More specifically, the outwardly extending arrows, shown extending from the NFET, illustrate a tensile stress that is desired in the transverse and longitudinal directions of the device. Similarly, the inwardly extending arrows, shown with relation to the PFET, illustrate a desired longitudinal compressive stress. The range of stresses needed to influence device drive currents is typically on the order of a few hundred MPa to a few GPa. The width and the length of the active area of each device is represented by "W" and "L", respectively. It should be understood that each of the longitudinal or transverse stress components can be individually tailored to provide the performance enhancements for both devices (i.e., the NFET and the PFET).

Figure 2A:
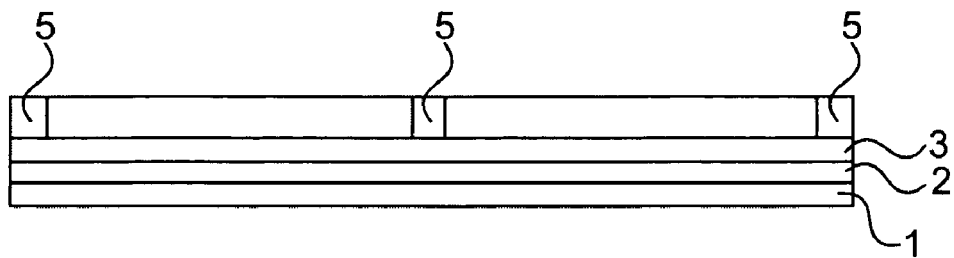
FIGS. 2(a) through 2(k) depict a process for forming gate MOSFETs according to the invention.

FIGS. 2(a) through 20(j) depict a general exemplary process for forming the MOSFETs according to this invention. FIGS. 2(a) through 2(d) explain processes that are known, and thus any known applicable processes may be used. FIG. 2(a) illustrates the structure after shallow trenches 5 (STI) are formed. A SOI (silicon-on-insulator) wafer which has a stack of silicon 1, buried oxide 2, and a silicon layer 3 is used. Generally, to form the STI on SOI wafers, a thin (~50 Å) layer of silicon dioxide $SiO_2$ (pad oxide) (not shown) is grown on the silicon layer 3, which is on the buried oxide layer 2 on the silicon substrate 1, by reacting silicon and oxygen at high temperatures. A thin layer (about 1000 Å to about 2500 Å) of pad silicon nitride ($Si_3N_4$) (not shown) is then deposited using chemical vapor deposition (CVD). Next, the patterned photoresist with a thickness of about 0.5 to about 1.0 microns is deposited, and the structure is exposed and developed to define the trench areas 5. Next, the exposed $SiO_2$ and the $Si_3N_4$ are etched using reactive ion etching (RIE). Next, an oxygen plasma is used to burn off the photoresist layer. A wet etch is used to remove the pad $Si_3N_4$ and pad oxide. Then, an oxide layer is deposited to fill the trenches and the surface oxide is removed using chemical mechanical polishing (CMP). This completes the formation of STI as seen in FIG. 2(a).

Figure 2B:
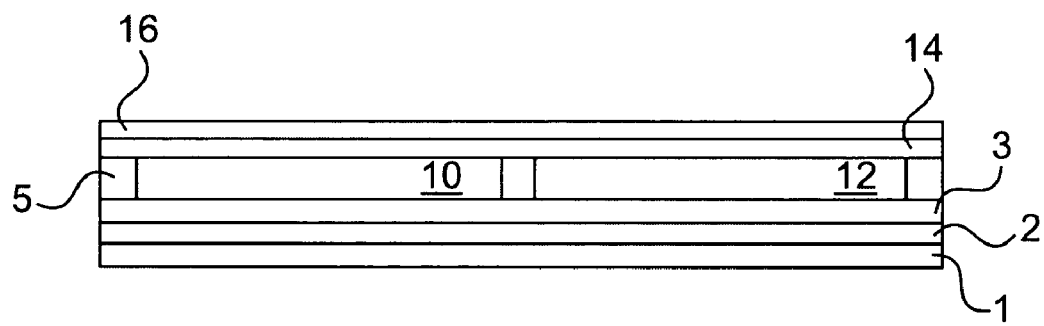

Next, a sacrificial oxide (not shown) of about 50 Å is grown on the silicon. Then, as shown in FIG. 2(b) an n-well 10 and a p-well 12 are formed. Patterned photoresist layers are used to successively form the n-well 10 (using, for example, multiple implants of Phosphorous ions) and the p-well 12 (using, for example, multiple implants of Boron ions). The well implants 10 and 12 are then optionally annealed. The sacrificial oxide layer is then removed using a wet HF solution, such that a clean silicon surface is left behind.

Next, as shown in FIG. 2(b), a gate oxide layer 14 of about 10 Å to about 100 Å is grown. On the gate oxide layer 14, a polysilicon layer 16 is deposited using CVD to a thickness of about 500 Å to about 1500 Å to form the gate electrodes 18 and 20 shown in FIG. 2(c). Patterned photoresist layers (not shown) are used to define the gate electrodes. RIE is used to etch the exposed portions of the polysilicon layer 16 and the photoresist patterns are stripped away in order to complete formation of the gate stack of the n-type transistor 17 and the gate stack of the p-type transistor 19.

Figure 2C:
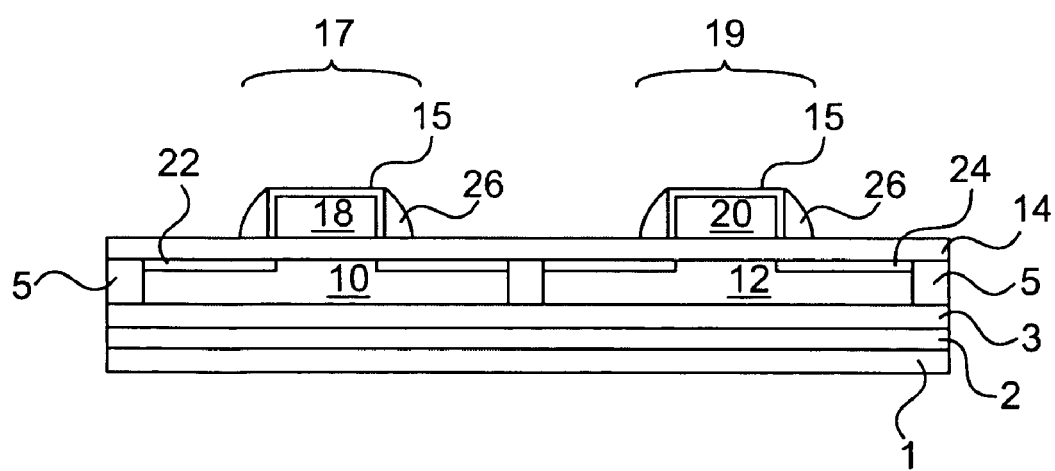

FIG. 2(c) shows the formed gate electrodes 18 and 20. A thin layer of oxide 15 is then grown on the remaining polysilicon. Patterned photoresist layers (not shown), which are later removed, are used to successively tip (and halo countering doping implants) implant the n-type and p-type transistors. For n-type transistors, a very shallow and low dose implant of arsenic ions, for example, may be used to form the p-tip 22 (while a Boron implant, for example, may be used for halos). For p-type transistors, a very shallow and low dose implant of $BF_2$ ions, for example, may be used to form n-tip 24 (while an arsenic implant may, for example, be used for halos).

Still referring to FIG. 2(c), spacers 26 are formed by depositing a silicon nitride layer (not shown) using CVD to a thickness of about 100 Å to about 1000 Å and then etching the nitride from the regions other than the sidewalls of the gate. Patterned photoresist layers (not shown), which are removed prior to the next stage of the process, are used to successively create the source/drain regions of the transistors.

Figure 2D:
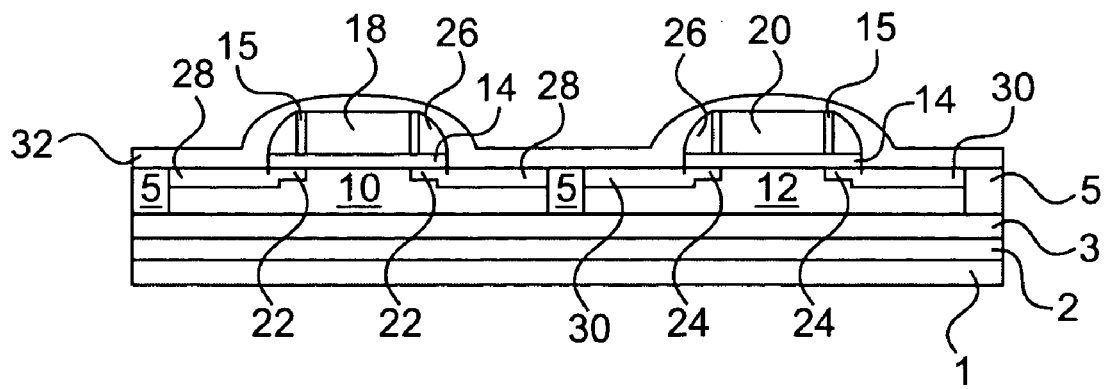

In FIG. 2(d), for the n-type transistors, a shallow and high-dose of arsenic ions, for example, may be used to form the source/drain regions 28 while the p-type transistors are covered with the corresponding photoresist layer. For the p-type transistors, a shallow and high dose of $BF_2$ ions, for example, may be used to form the source/drain regions 30 while the n-type transistors are covered with the corresponding photoresist layer. An anneal is then used to activate the implants. The exposed oxide on the structure is then stripped by dipping the structure in HF in order to expose bare silicon in the source, gate and drain regions of the transistors.

Still referring to FIG. 2(d), metal or a low resistance material 32 is deposited to a thickness of about 30 Å to about 200 Å across the wafer surface in order to form silicide. The silicide could be formed from reacting the underlying with any deposited metal such as Co, Hf, Mo, Ni, Pd2, Pt, Ta, Ti, W, and Zr. In the regions, such as, the source, drain and gate regions, where the deposited metal is in contact with silicon, the deposited metal or low resistance material reacts with the silicon to form silicide. In the other regions (i.e., where the deposited metal is not in contact with silicon), the deposited metal remains unchanged. This process aligns the silicide to the exposed silicon and is called "self-aligned silicide" or salicide.

Figure 2E:
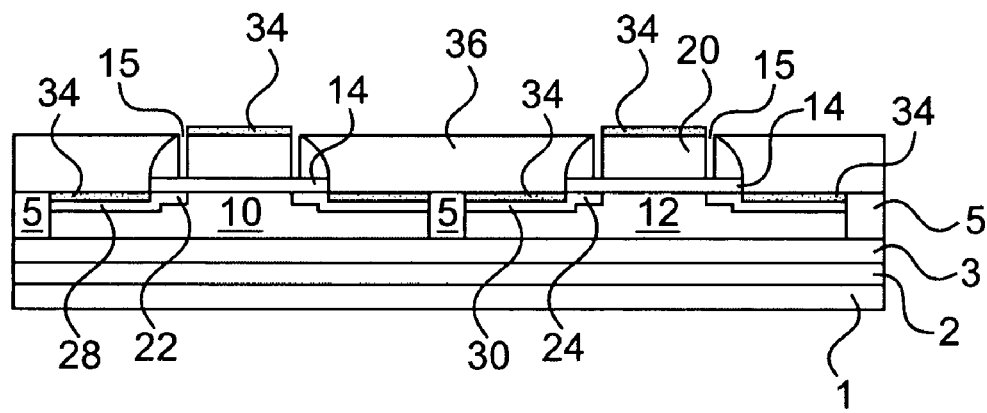
Figure 2F:
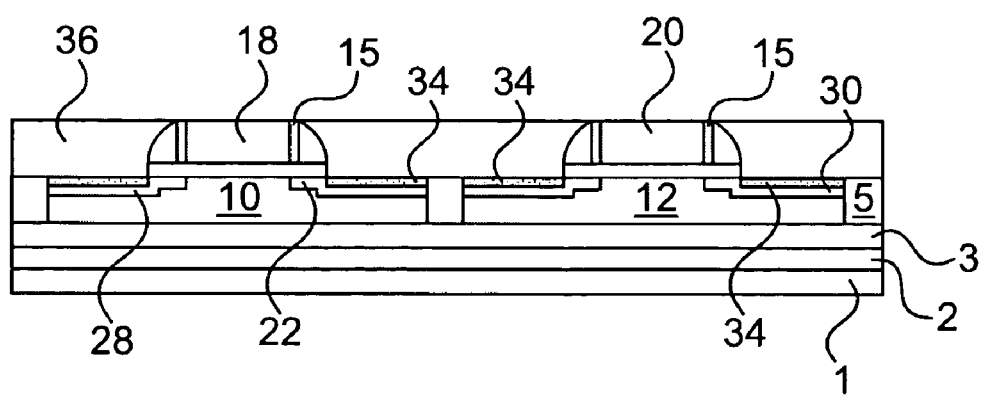

The unreacted metal is then removed using a wet etch while the formed silicide 34 remains, as shown in FIG. 2(e). As shown in FIG. 2(e), an oxide fill followed by chemical mechanical polishing is used to planarize the surface. CMP is used to make the oxide fill flat and such that the oxide fill is flushed with the top of the gates. Next, as shown in FIG. 2(f), the silicide 34 on top of the polysilicon is removed using a selective etch.

Figure 2G:
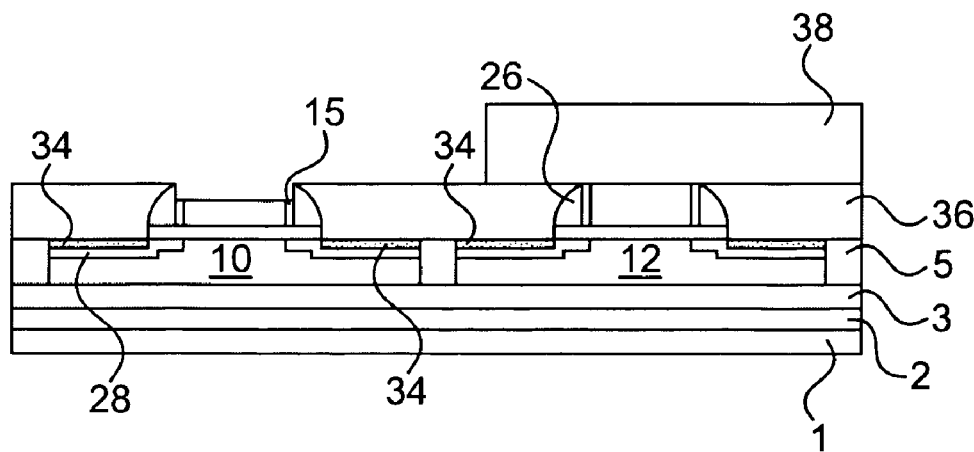

In methods according to the invention, the PFET devices of the structure shown in FIG. 2(g) are masked, using a mask 38. The mask 38 may be, for example, a hard mask, such as for example, a mask made of nitride. To form the mask 38, nitride, for example, may be deposited on the silicon wafer and the nitride covering the polysilicon gates of the NFETs may be etched to expose the polysilicon gates of the NFETs. The mask exposes the NFETs so that the additional silicide 34 on the gate polysilicon of the NFETs may be etched off from the gate polysilicon of the NFET, as shown in FIG. 2(g).

Figure 2H:
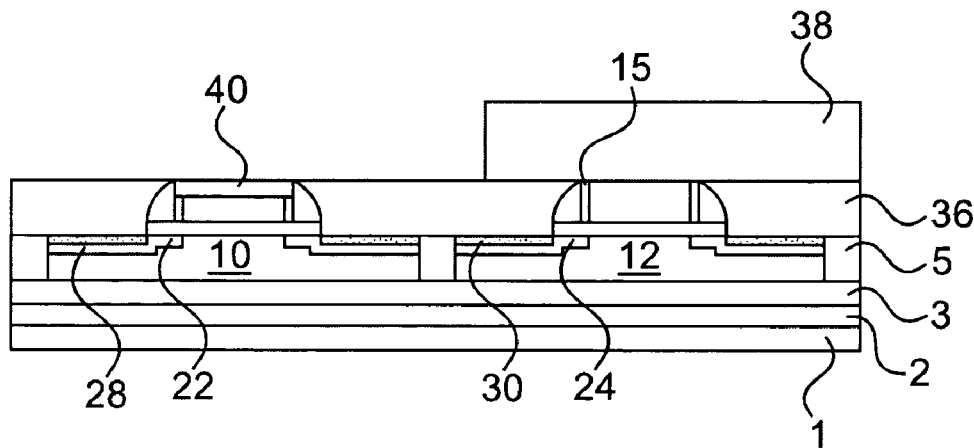

As shown in FIG. 2(h), the mask 38 covers the PFETs during oxidation of the NFETs, such that the gate polysilicon of the PFETs is not oxidized while oxide 40 is deposited on the gate polysilicon of the NFETs.

Figure 2I:
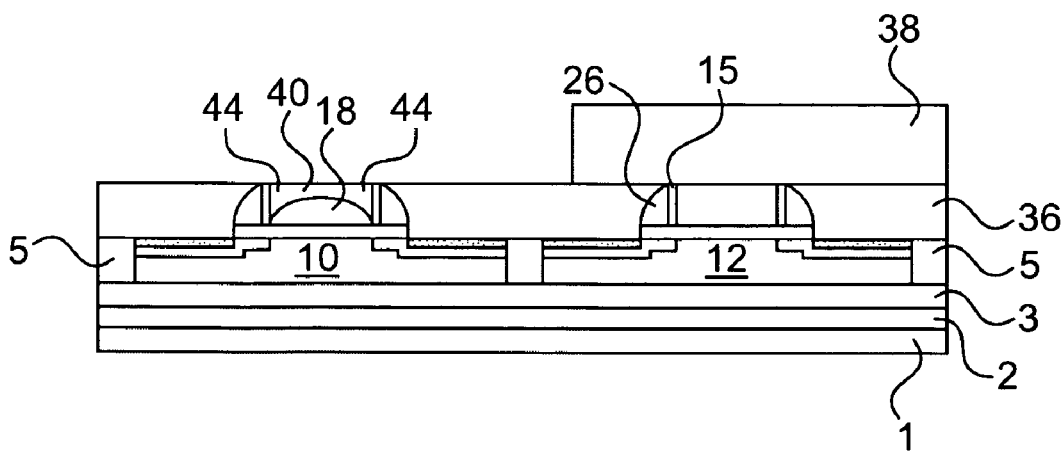

As also shown in FIG. 2(i), oxidation of the gate polysilicon of the NFETs results in the formation of a vertical bird's beak 44 in the edge of the polysilicon of the NFETs. The oxidation of the gate of the NFETs creates large tensile stresses in the channel region of the NFETs. Since the PFETs are masked, with mask 38, the polysilicon gates of the PFETs are not oxidized. Further, these tensile stresses increase electron mobility along the channel, and improve the performance of the NFETs. The oxidation of the gate polysilicon of the NFETs should be a low temperature oxidation, such as, for example, high pressure oxidation, atomic oxidation or plasma oxidation. The oxidation step should be performed at a low temperature, such as, 600° C. or less in order to prevent degradation of device characteristics, via, for example, deactivation or diffusion. Low temperature oxidation should be used so that (a) the already created silicide on the source/drain regions does not agglomerate and/or change resistivity and (b) so that the extensions, and source and drain dopants do not diffuse and/or deactivate. Typically, the oxidation should result in about a vertically formed bird's beak of about 20 Å to about 100 Å in width and height.

As shown in FIG. 2(i), the vertical bird's beak 44 causes the base of the polysilicon to be wider than an uppermost surface of the polysilicon and the side edges of the polysilicon taper towards the uppermost surface thereof. In addition, as shown in FIG. 2(i) in a region where the polysilicon tapers towards the uppermost surface, a portion of the gate stack 17 of the NFET comprises a portion of the polysilicon layer and a portion of the deposited oxide forming a vertical bird's beak 44 are present along a plane perpendicular to a plane of the base of the polysilicon. Each vertical bird's beak 44 may have, for example, a width of about 20 Å to about 100 Å.

Figure 2J:
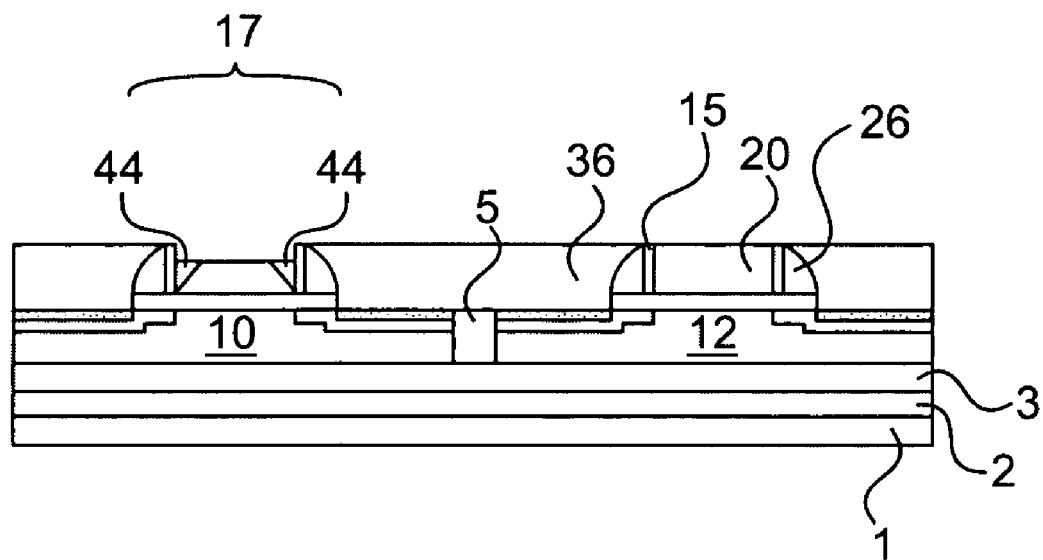
Figure 4:
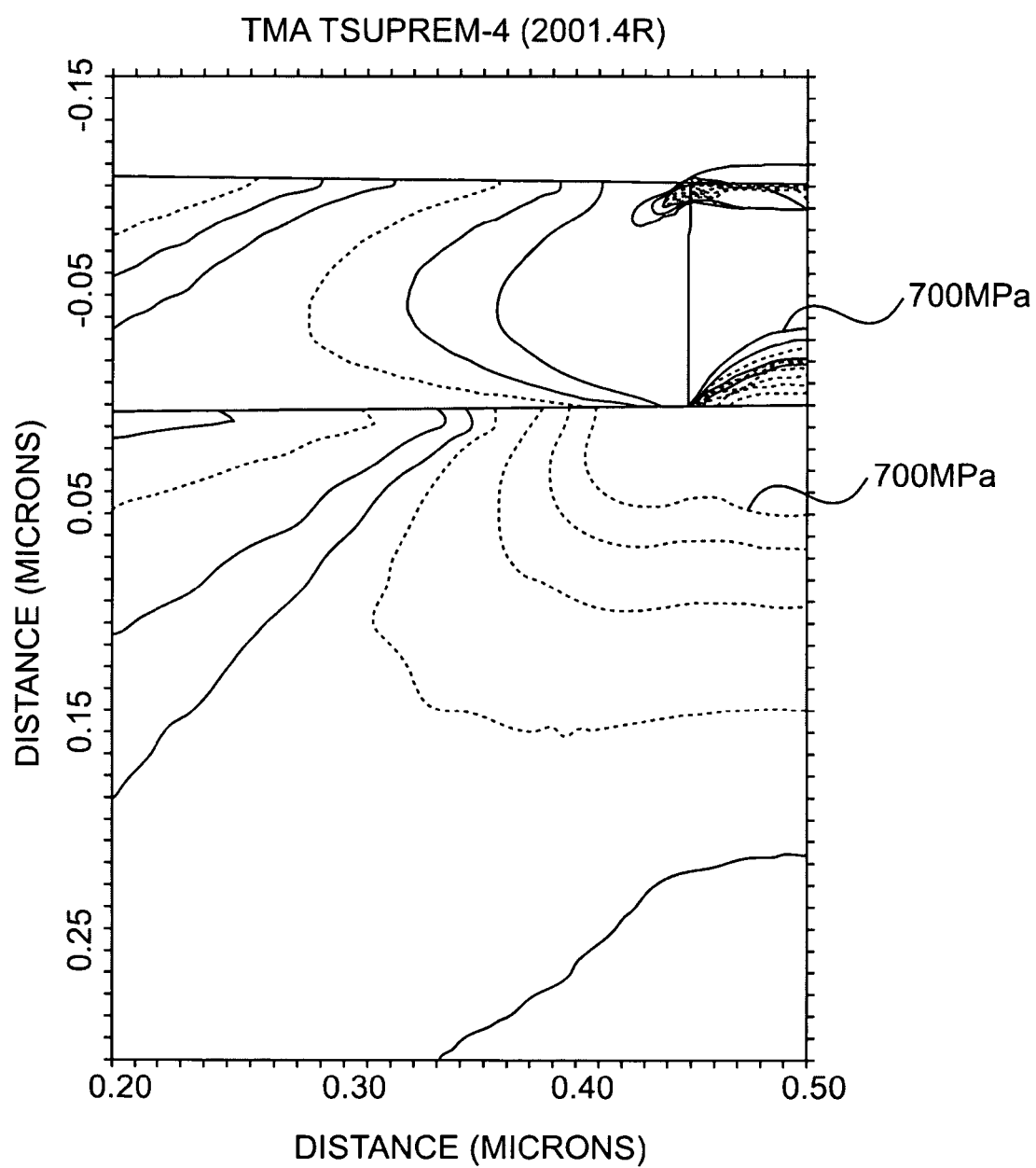
FIG. 4 depicts stresses in a silicon structure after oxidation of the gate polysilicon according to the invention.
Figure 5:
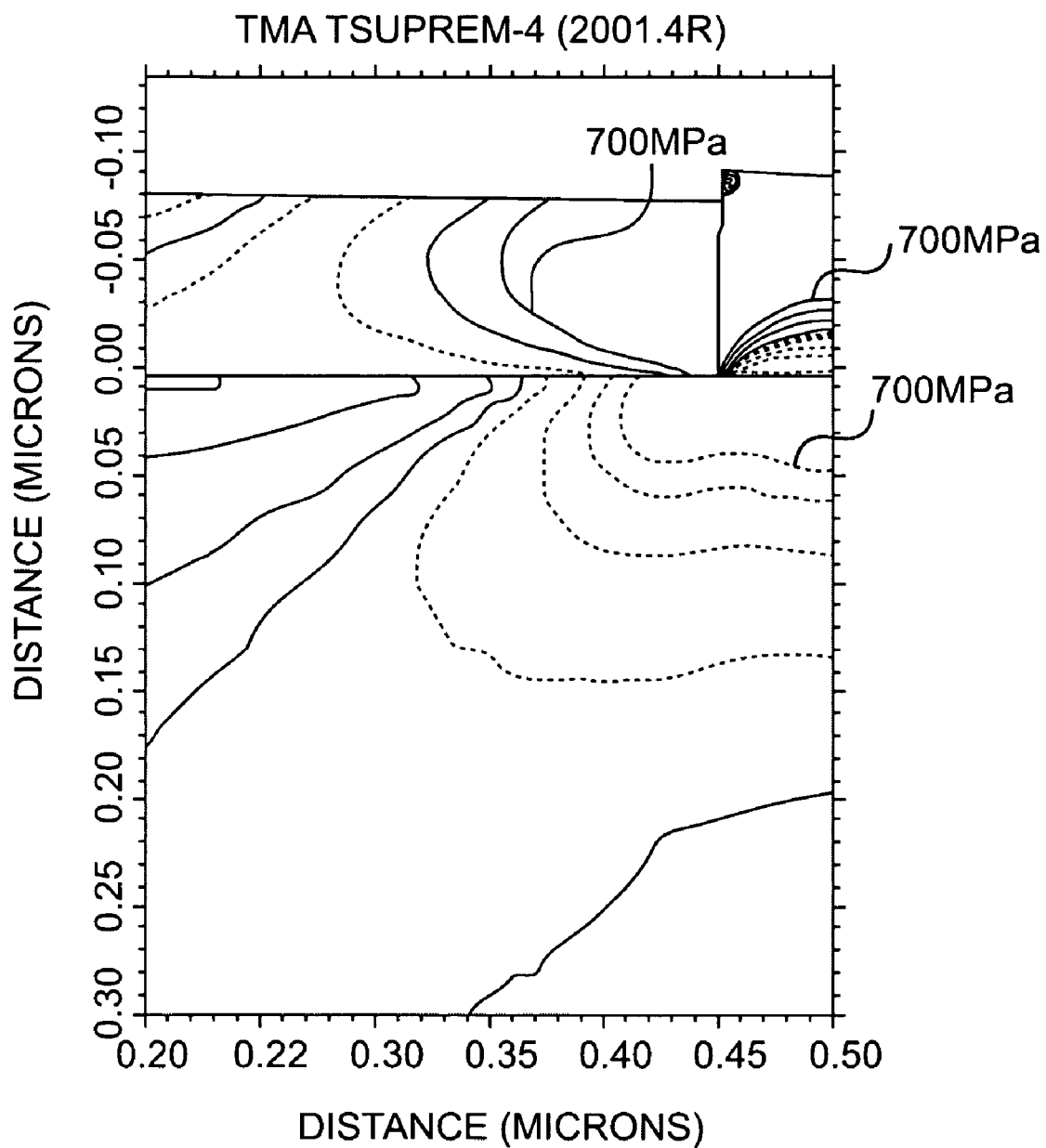
FIG. 5 depicts stresses in a silicon structure after etching of deposited oxide during oxidation of the gate polysilicon according to the invention.

As further shown in FIG. 2(j), the oxide above the gate polysilicon of the NFETs is etched off while the vertical oxide bird's beak is still preserved. The stresses created in the gate polysilicon of the NFETs are maintained even after removal of this oxide on top of the polysilicon as a result of the vertical bird's beak formed in the gate polysilicon of the NFETs because of the oxidation step, as shown in FIGS. 4 and 5. As also shown in FIG. 2(j), the mask 38 has been removed.

Figure 2K:
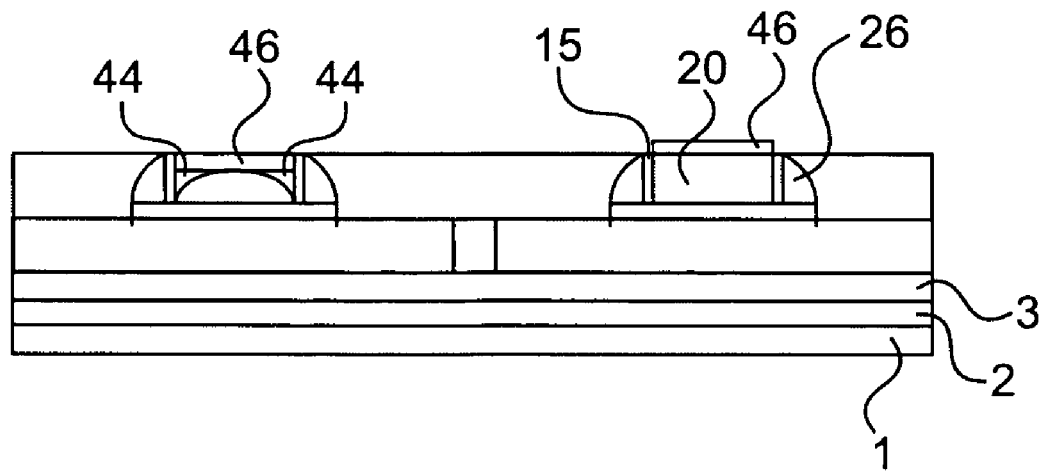

Then, as shown in FIG. 2(k), silicide forming material 46 is deposited on the polysilicon gate of the NFETs after removing the mask 38. Material, such as, for example, Co, HF, Mo, Ni, $Pd_2$, Pt, Ta, Ti, W, and Zr may be used to form the silicide. When material, such as, for example, Co, HF, Mo, Ni, $Pd_2$, Pt, Ta, Ti, W, and Zr is deposited on silicon, the silicon reacts with the material and silicide is formed. The material for forming silicide may be deposited over the wafer via, for example, evaporation, sputtering, or CVD techniques. Next, the structure is heated to temperature of about 300° C. to about 700° C. to allow the deposited silicide material to react with the polysilicon. During sintering, silicide only forms in the regions where metal is in direct contact with silicon or polysilicon. The remaining unreacted silicide material is then removed, for example, with a selective etch without damaging the formed silicide. After this, the standard middle of the line (e.g., passivation and contact formation) and back end of the line (various interconnect metal, via, and interlevel dielectrics) processes are performed.

Figure 3A:
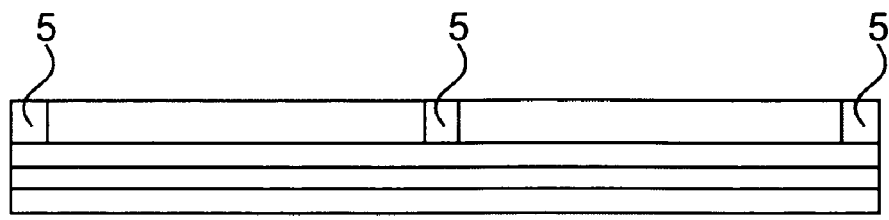
FIGS. 3(a) through 3(g) depict a portion of another process for forming gate MOSFETs according to the invention.
Figure 3B:
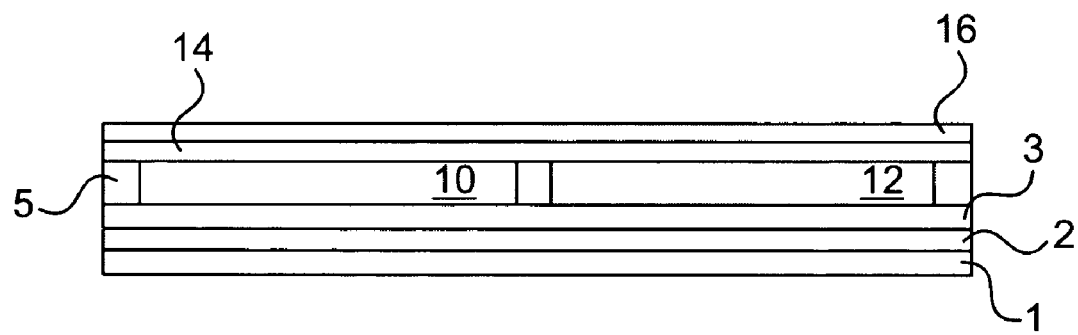
Figure 3C:
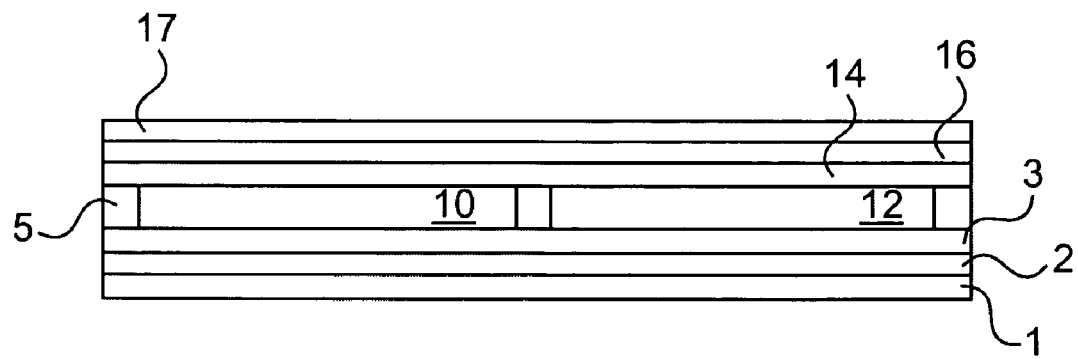
Figure 3D:
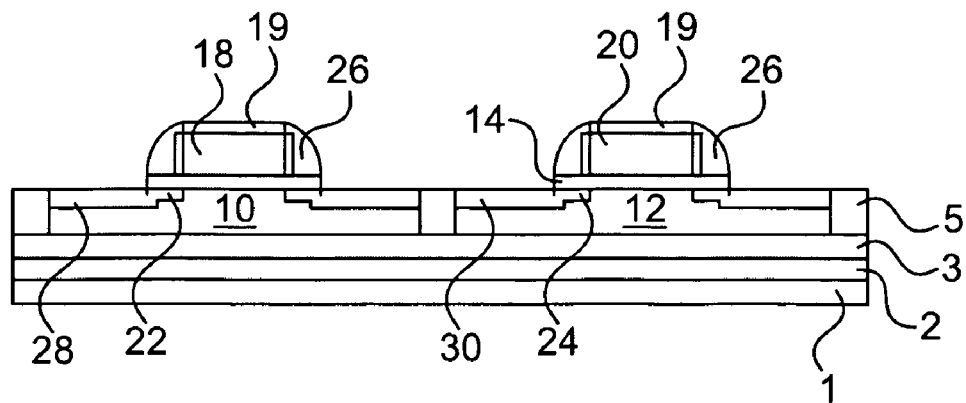

In another embodiment of the invention, a nitride cap may be provided on the gate polysilicon of the NFET instead of the metal or low-resistance material. For ease of discussion, the portions of the process which are the same as the processes described with regard to FIGS. 2(a)–2(k) will not be repeated below. In this embodiment, the description of the structure illustrated in FIGS. 2(a) and 2(b) applies to the structure illustrated in FIGS. 3(a) and 3(b). Then, as shown in FIG. 3(c), a nitride layer 17 is deposited on the surface. As shown in FIG. 3(d), spacers 26 are formed by depositing a silicon nitride layer using CVD to a thickness of about 100 Å to about 1800 Å and then etching the nitride from the regions other than the sidewalls of the gate. The nitride cap 19, above the polysilicon of the NFET and PFET is retained.

Figure 3E:
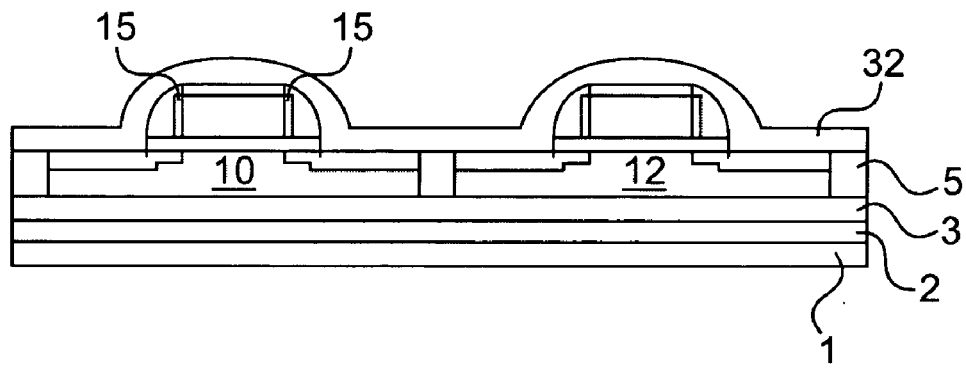
Figure 3F:
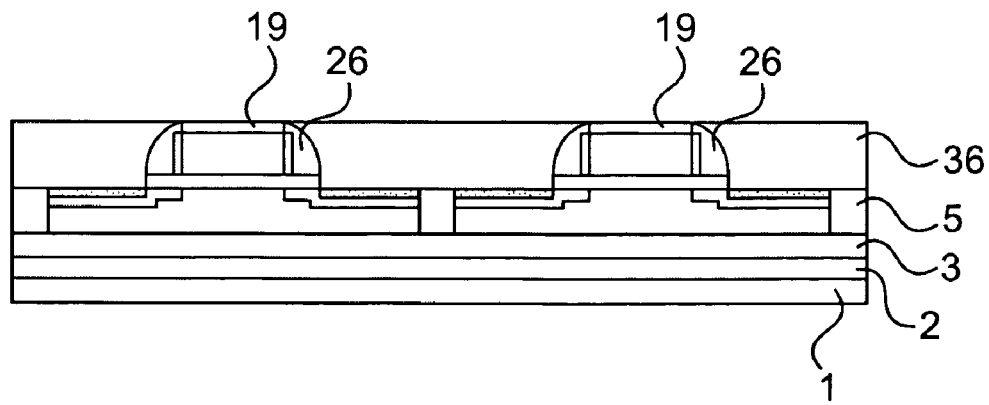
Figure 3G:
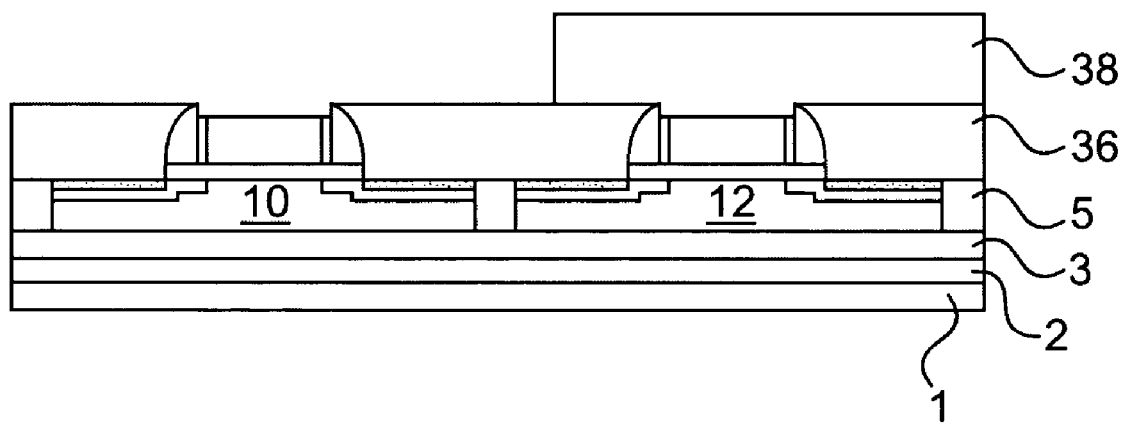

As shown in FIG. 3(e), silicide forming material 32 is deposited on the surface. As discussed above, a metal or a low resistance material 32 is deposited to a thickness of about 30 Å to about 200 Å across the wafer surface in order to form silicide 34 (see FIG. 3(f)). Silicide is formed in the source and drain regions of the transistors (i.e., where the silicide is in contact with the silicon) and the unreacted material is removed. As shown in FIG. 3(g), an oxide fill 36 followed by chemical mechanical polishing is used to planarize the surface. CMP is used to make the oxide fill flat and such that the oxide fill is flushed with the top of the gates.

Next, in this embodiment, the nitride caps 19 are stripped off from the polysilicon gates of the transistors. In methods according to the invention, the PFET devices of the structure shown in FIG. 3(g) are masked, using a mask 38. The description of FIGS. 2(g) through 2(k) applies for the remainder of the process.

FIG. 4 shows the stresses in the gate structure after oxidation of the gate polysilicon of the NFET. The dashed lines represent tensile stress and the solid lines represent compressive stress. As can be seen from FIG. 4, tensile stresses are present in the channel area of the NFET. In structure illustrated in FIG. 4, tensile stresses of about 1 GPa and less are present in the channel area of the NFET.

FIG. 5 shows the stresses in the gate structure when the oxide above the gate polysilicon is etched in accordance with this invention. This etch is needed since the gate polysilicon has to be silicided for contact formation later. Similar to FIG. 4, the dashed lines represent the tensile stress and the solid lines represent the compressive stress. As can be seen from FIG. 5, the stresses in the NFET device is maintained even after etching of the oxide from above the gate polysilicon.

The tensile stresses in the NFET device is maintained even after etching of the oxide due to the formation of the vertical bird's beak in the gate polysilicon as a result of the oxidation of the gate polysilicon. The desired stresses are tensile and add values of the order of 200 MPa and above.

By providing tensile stresses to the channel of the NFET and without creating additional tensile stresses in the channel of the PFETs, the charge mobility along the channels of NFET devices is enhanced while the hole mobility along the channels of the PFET devices is maintained. Thus, as described above, the invention provides a method for providing tensile stresses along the longitudinal direction of the channel of NFET devices by oxidizing the polysilicon gate of the NFET devices after silicidation of the gate polysilicon.

It should be understood that this invention is readily applicable to bulk or layered SiGe substrates. It should also be understood that this invention may also be used with damascene gate structures, which have been proposed for use of high k dielectric gate oxides.

While the invention has been described in terms of embodiments, those skilled in the art will recognize that the invention can be practiced with modification within the spirit and scope of the appended claims.

What is claimed is:

1. A method for manufacturing an integrated circuit comprising a plurality of semiconductor devices including an n-type transistor and a p-type transistor on a semiconductor wafer, the method comprising:
   covering the p-type transistor with a mask;
   oxidizing a portion of the gate polysilicon of the n-type transistor, such that tensile mechanical stresses are formed within a channel of the n-type transistor; and
   removing, after the oxidizing step, oxide formed during the oxidizing step from above the gate polysilicon of the n-type transistor,
   wherein the oxidizing step results in formation of a bird's beak in an edge of the gate polysilicon between the gate polysilicon and a spacer of the n-type transistor and the removing step preserves the bird's beak.

2. The method of claim 1, wherein the step of covering comprises covering the p-type transistor with a mask made of nitride.

3. The method of claim 1, wherein the step of oxidation is performed using low temperature oxidation.

4. The method of claim 1, wherein the step of oxidation is performed using at least one of high pressure oxidation or atomic oxidation or plasma oxidation.

5. The method of claim 1, wherein the step of oxidation is performed between a temperature of about 25° C. to about 600° C.

6. The method of claim 1, further comprising forming a planarized oxide layer on the semiconductor wafer.

7. The method of claim 6, further comprising removing silicide material from above the gate polysilicon of the n-type field effect transistor.

8. The method of claim 7, wherein the step of removing silicide material from above the gate polysilicon of the n-type field effect transistor comprises etching the silicide material from above the gate polysilicon of the n-type field effect transistor.

9. The method of claim 1, wherein the removing step comprises removing a deposited oxide from above the gate polysilicon of the n-type field effect transistor by etching the deposited oxide from above the gate polysilicon of the n-type field effect transistor.

10. A method for manufacturing an integrated circuit comprising a plurality of semiconductor devices including an n-type transistor and a p-type transistor on a semiconductor wafer, the method comprising:
    covering the p-type transistor with a mask;
    oxidizing a portion of a gate polysilicon of the n-type transistor, such that tensile mechanical stresses are formed within a channel of the n-type transistor, wherein the oxidizing results in formation of a bird's beak in an edge of the gate polysilicon;
    removing, after the oxidizing step, oxide above the gate polysilicon of the n-type transistor, the removing step comprising removing a deposited oxide from above the gate polysilicon of the n-type field effect transistor by etching the deposited oxide from above the gate polysilicon of the n-type field effect transistor; and
    depositing silicide material on at least the portion of the gate polysilicon of the n-type field effect transistor.

11. The method of claim 10, wherein the step of depositing silicide forming material on at least the portion of the gate polysilicon of the n-type field effect transistor comprises depositing at least one of Co, Hf, Mo, Ni, $Pd_2$, Pt, Ta, Ti, W, and Zr.

12. The method of claim 10, further comprising removing the mask used to cover the p-type field effect transistor.

13. The method of claim 1, further comprising depositing at least one of a silicide material or a nitride cap on at least the gate polysilicon of the n-type field effect transistor and removing silicide material or the nitride cap from above the gate polysilicon of the n-type field effect transistor prior to performing the step of oxidizing.

14. The method of claim 1, wherein the step of oxidizing comprises oxidizing the gate polysilicon of the n-type field effect transistor to create a stress of about 700 MPa in a channel of the n-type field effect transistor.

15. The method of claim 1, wherein the step of oxidizing comprises oxidizing the gate polysilicon of the n-type field effect transistor to create tensile mechanical stresses are about 500 Pa to about 1000 Pa.

16. A method for manufacturing an integrated circuit comprising a plurality of semiconductor devices including an n-type field effect transistor and a p-type field effect transistor on a semiconductor wafer, the method comprising forming oxide between a side of a gate polysilicon and a spacer of the n-type field effect transistor, oxidizing a portion of the gate polysilicon of the n-type field effect transistor, such that tensile mechanical stresses are formed within a channel of the n-type field effect transistor, without creating additional tensile stresses in a channel of the p-type field effect transistor,, and removing oxide formed during the oxidizing step from above the gate polysilicon of the n-type field effect transistor, wherein the oxidizing step results in formation of a bird's beak in an edge of the gate polysilicon between the gate polysilicon and the spacer and the removing step preserves the bird's beak.

17. The method of claim 1, wherein the step of oxidizing a portion of a gate polysilicon of the n-type transistor is performed after silicidation of the gate polysilicon.

18. The method of claim 1, wherein the tensile stresses are formed along a longitudinal direction of the channel of the n-type transistor.

19. A method for manufacturing an integrated circuit comprising a plurality of semiconductor devices including an n-type transistor and a p-type transistor on a semiconductor wafer, the method comprising:
forming a first oxide above a gate polysilicon and between a side of the gate polysilicon and a spacer of the n-type transistor,
masking the p-type transistor;
removing the first oxide from above the pate polysilicon of the n-type transistor while allowing the first oxide to remain between the side of the gate polysilicon and the spacer,
oxidizing a portion of the gate polysilicon of the n-type transistor, such that tensile mechanical stresses are formed within a channel of the n-type transistor; and
removing the oxide formed during the oxidizing from above the gate polysilicon of the n-type transistor,
wherein, after the removing of the oxide formed during the oxidizing, a bird's beak remains in the gate polysilicon between the gate polysilicon and the spacer of the n-type transistor.

20. The method of claim 19, wherein the oxidizing step forms the bird's beak and the removing step preserves the bird's beak.

21. The method of claim 1, further comprising forming oxide between a side of the gate polysilicon and the spacer of the n-type transistor.

22. A method of forming a device, comprising:
forming a PFFT and NFFT structure each having polysilicon gate structures;
depositing a metal or a low resistance material to a thickness of about 30 Å to about 200 Å across the polysilicon gate structures and exposed surfaces;
removing unreacted metal while formed silicide remains on the polysilicon gate structures;
planarizing an oxide fill formed over the silicide;
removing the silicide on top of the polysilicon gate structures using a selective etch;
protecting the PFET polysilicon gate structures and exposing the NFET polysilicon gate structures;
oxidizing the NFET, while protecting the PFET with a mask, such that the polysilicon gate structures of the PFET are not oxidized while oxide is deposited on the polysilicon gate structures of the NFET resulting in a formation of a vertical bird's beak in an edge of polysilicon of the polysilicon gate structures of the NFET.

23. The method of claim 22, wherein the silicide is formed from reacting an underlying layer with Co, Hf, Mo, Ni, Pd2, Pt, Ta, Ti, W, or Zr.

24. The method of claim 22, wherein the forming of the silicide is a self-aligned silicide process.

25. The method of claim 22, wherein the mask is a hard mask made of nitride.

26. The method of claim 25, wherein the nitride covering the polysilicon gate structures of the NFET is etched to expose the polysilicon gate structures of the NFET.

27. The method of claim 22, wherein the oxidation of the polysilicon gate structures of the NFET creates tensile stresses in a channel region of the NFET.

28. The method of claim 22, wherein the tensile stresses increase electron mobility along the channel.

29. The method of claim 22, wherein the oxidation of the polysilicon gate structures of the NFET is performed at a temperature of 600° C. or less to prevent degradation of device characteristics.

30. The method of claim 22, wherein the oxidation results in about a vertically formed bird's beak of about 20 Å to about 100 Å in width and height.

31. The method of claim 22, wherein the vertical bird's beak causes a base of the polysilicon to be wider than an uppermost surface of the polysilicon and side edges of the polysilicon taper towards the uppermost surface.

32. The method of claim 31, wherein deposited oxide forming the vertical bird's beak is present along a plane perpendicular to a plane of the base of the polysilicon.

33. The method of claim 22, wherein the oxide above the polysilicon gate structures of the NFET is etched off while the vertical bird's beak is preserved.

34. The method of claim 33, wherein stresses created in the polysilicon gate structure of the NFET are maintained after removal of the oxide on top of the polysilicon as a result of the vertical bird's beak formed in the gate polysilicon structures of the NFET.

35. The method of claim 22, further comprising:
growing an oxide on the polysilicon gate structures;
forming spacers sidewalls of the polysilicon gate structures; and
forming source and drain regions for the polysilicon gate structures.

* * * * *